United States Patent [19]

Shirasaka

[11] 4,321,587
[45] Mar. 23, 1982

[54] DISPLAY UNIT WITH A REMOVABLE INDICATOR PANEL

[75] Inventor: Susumu Shirasaka, Osaka, Japan

[73] Assignee: Sanyo Electric Co., Ltd., Moriguchi, Japan

[21] Appl. No.: 137,493

[22] Filed: Apr. 4, 1980

[30] Foreign Application Priority Data

Nov. 20, 1979 [JP] Japan .......................... 54/161399[U]
Mar. 10, 1980 [JP] Japan ............................ 55/31618[U]
Mar. 10, 1980 [JP] Japan ............................ 55/31619[U]
Mar. 11, 1980 [JP] Japan ............................ 55/31907[U]

[51] Int. Cl.³ ............................................. G09F 3/14
[52] U.S. Cl. ............................... 340/381; 340/286 R
[58] Field of Search ........................... 340/381, 286 R; 361/393

[56] References Cited

U.S. PATENT DOCUMENTS

| | | | |
|---|---|---|---|
| 1,751,426 | 3/1930 | Sprenger | 116/300 |
| 2,871,450 | 1/1959 | Podoloff | 324/154 R |
| 3,557,748 | 1/1971 | Bowditch | 116/334 |
| 3,675,242 | 7/1972 | Hammell | 340/381 |
| 3,681,552 | 8/1972 | Bailey | 340/381 |
| 3,763,400 | 10/1973 | Layton | 361/393 |
| 3,969,721 | 7/1976 | Chadwick | 340/381 |
| 4,118,991 | 10/1978 | Bevacqua | 74/10.33 |

FOREIGN PATENT DOCUMENTS

| | | |
|---|---|---|
| 2747879 | 5/1929 | Fed. Rep. of Germany . |
| 924518 | 3/1955 | Fed. Rep. of Germany . |
| 1220914 | 7/1966 | Fed. Rep. of Germany . |
| 1766550 | 9/1970 | Fed. Rep. of Germany . |
| 2056416 | 5/1972 | Fed. Rep. of Germany . |
| 2314626 | 9/1974 | Fed. Rep. of Germany . |
| 2731825 | 2/1978 | Fed. Rep. of Germany . |
| 1101619 | 1/1968 | United Kingdom . |

*Primary Examiner*—Harold I. Pitts
*Attorney, Agent, or Firm*—Darby & Darby

[57] ABSTRACT

A display unit includes a casing formed with an opening and a removable panel adopted to be mounted in the opening. The casing has a groove formed in a portion of the edge defining the opening. The removable panel has a projection extending outwards from a portion of its perimeter and engageable in the groove. The removable panel is mounted in the opening in the casing with the projection engaged in the groove.

19 Claims, 22 Drawing Figures

DISPLAY UNIT WITH A REMOVABLE INDICATOR PANEL

BACKGROUND OF THE INVENTION

1. Field of the Invention

The present invention relates to a display unit and, more particularly, to an assembly of the display unit with a removable indicator panel.

2. Description of the Prior Art

Usually, various machines and devices have control switches and buttons provided in association with a display unit showing the mode of the controlled state on its indicator panel. In the field of audio devices, for example, a tuner has a tuning knob and a display unit for showing a tuned station selected by the tuning knob. In the case where the display unit of the tuner is constituted of an elongated dial plate and an indicator needle, the elongated dial plate is usually held horizontally. However, from the view point of layout of the dial plate and a space given to the tuner, the elongated dial plate is sometimes held vertically. For example, in the case where the audio device is to be installed in the vehicle, the elongated dial plate may be installed vertically in one vehicle model and, horizontally in another vehicle model, depending on the layout of various indicators on the dashboard. For this purpose, the audio maker has to manufacture two types of audio devices having a different layout of indicium on the indicator panel but the same functional structure.

SUMMARY OF THE INVENTION

Accordingly, it is a primary object of the present invention to provide a display unit which can be easily disassembled for replacing the indicator panel.

It is a further object of the present invention to provide a display unit of the above described type which is simple in construction and can readily be manufactured at low cost.

In accomplishing these and other objects, a display unit according to the present invention has a casing formed with an opening and a removable panel adopted to be mounted in said opening, characterized in that said casing has a groove formed in a portion of the edge defining said opening. The removable panel has a projection extending outwards from a portion of the perimeter thereof and engagable in the groove. The removable panel is mounted in the opening in the casing with its projection engaged in the groove.

According to one embodiment of the present invention, a display unit has a casing formed with an opening and a removable panel adopted to be mounted in the opening, characterized in that the casing has a portion detachable from the casing at a place adjacent to the opening. The detachable portion has a means engagable with the removable panel for retaining the removable panel in the opening when the detachable portion is attached to the casing.

According to a preferred embodiment of the present invention, a display unit comprises a removable panel including indicium depicted therein and having first and second means formed respectively on edge portions of the panel opposed to each other, and a casing having first and second walls connected together to assume a generally L-shaped cross-section. The first wall has an opening defined therein. The opening is recessed inwardly from one edge of the first wall connected to the second wall. The first wall has a third means formed on a portion of the peripheral edge of the opening remote from the joint of the first and second walls. The second wall has a fourth means. The panel is adopted to be accommodated in the opening with the first means engaged with the third means.

The display unit according to the preferred embodiment further comprises a support plate means having fifth and sixth means, and a guide means for guiding the support plate means slidingly in a direction parallel to the second wall from an extracted position in which the support plate means is separated from the casing to an inserted position in which the support plate means is attached to the second wall by the guide means. When the support plate means is inserted to the inserted position, the fifth means of the support plate means is engaged with the fourth means of the second wall for retaining the support plate means in the inserted position, and, at the same time, the sixth means of the support plate means is engaged with the second means of the panel for retaining the panel in the opening.

BRIEF DESCRIPTION OF THE DRAWINGS

These and other objects and features of the present invention will become apparent from the following description taken in conjunction with preferred embodiments thereof with reference to the accompanying drawings, throughout which like parts are designated by like reference numerals, and in which.

DETAILED DESCRIPTION OF PREFERRED EMBODIMENTS

Before the description of the present invention proceeds, it is to be noted that the embodiment of the present invention is directed to a display unit for use in an audio device including radio receiver and cassette device designed for being mounted on a vehicle.

Figure 1:
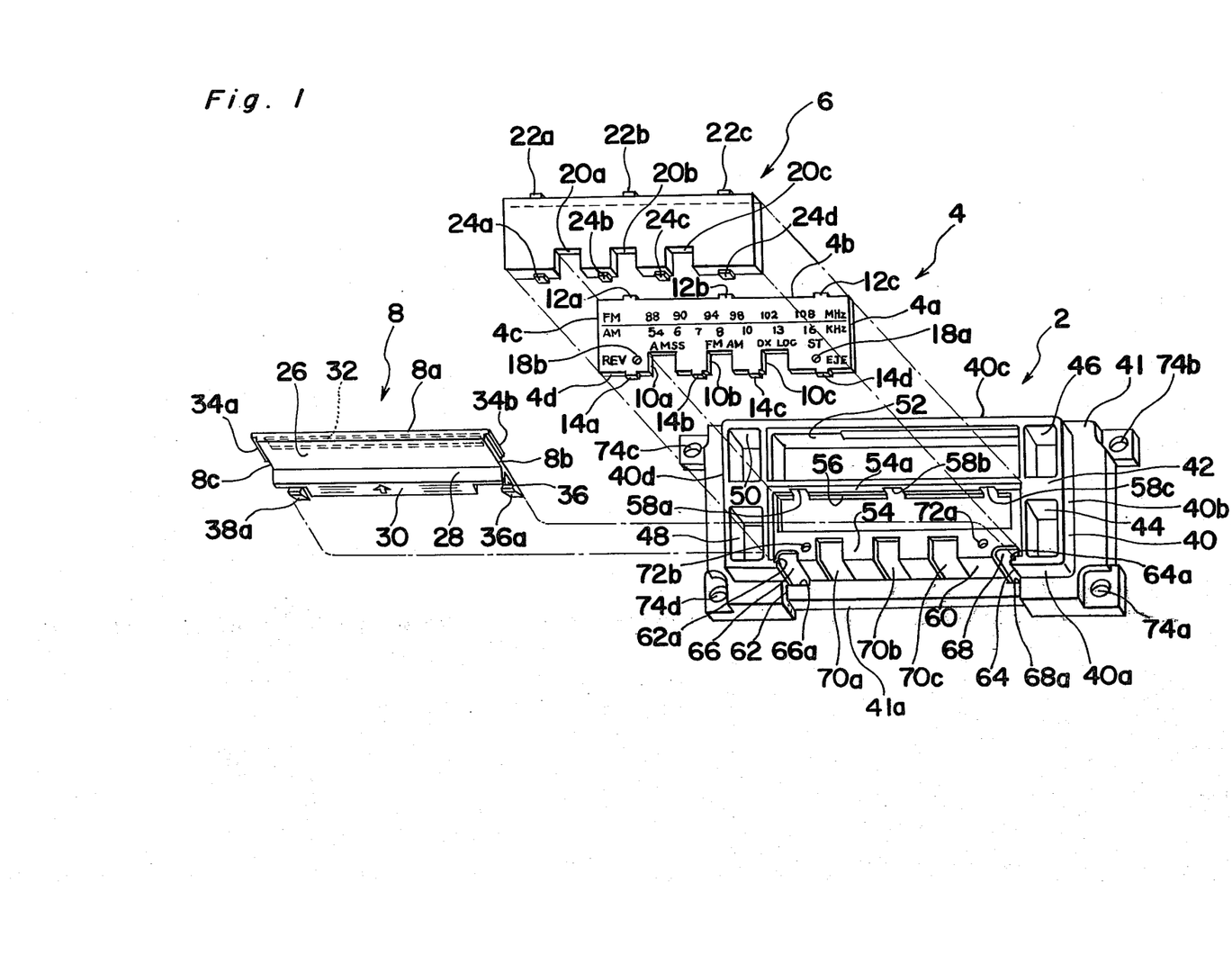
FIG. 1 is an exploded perspective view of a display unit according to one embodiment of the present invention.

Referring to FIG. 1, a display unit according to the present invention includes a panel casing 2, an indicator panel 4, a guard plate 6 and a support plate 8, each of which are described in detail below.

The indicator panel 4 made of a transparent synthetic resin plate has an elongated rectangular shape defined by four side edges 4a, 4b, 4c and 4d. Three square recesses 10a, 10b and 10c are formed in the longitudinal side edge 4d at predetermined intervals with each other. The indicator panel 4 has three engagement projections 12a, 12b and 12c extending from the side edge 4b; the projections 12a and 12c are positioned at opposite end portions of the side edge 4b; and the projection 12b is positioned approximately at the center portion of the side edge 4b. The indicator panel 4 further has four engagement projections 14a, 14b, 14c and 14d extending from the side edge 4d; the projections 14a and 14d are positioned at opposite end portions of the side edge 4d; the projection 14b is positioned between the recesses 10a and 10b; and the projection 14c is positioned between the recesses 10b and 10c.

Figure 2:
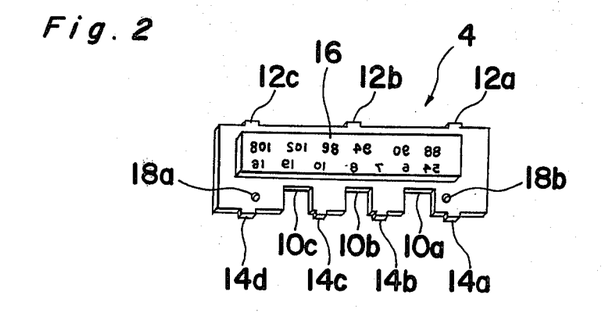
FIG. 2 is a perspective view of an indicator panel showing an opposite side to the side shown in FIG. 1.

The indicator panel 4 shown in FIG. 1 has indicium, such as numbers and characters so depicted on its front surface as to be in the correct readable position when the indicator panel 4 is held horizontally as shown. The indicator panel 4 has on its back, as shown in FIG. 2, a rectangular plate 16 made of a transparent synthetic resin rigidly mounted on, or integrally formed with, the back surface.

According to a preferred embodiment, the indicator panel 4 has small through-holes 18a and 18b formed adjacent to the engagement projections 14a and 14d, respectively, for the path of light.

The guard plate 6 made of a transparent synthetic resin plate has, when viewed from front, exactly the same configuration as that of the indicator panel 4 so that the guard plate 6 exactly overlaps the front surface of the indicator panel 4. More specifically, the guard plate 6 has three recesses 20a, 20b and 20c corresponding to the recesses 10a, 10b and 10c, respectively, of the indicator panel 4, three engagement projections 22a, 22b and 22c corresponding to the engagement projections 12a, 12b and 12c, respectively, of the indicator panel 4, and four engagement projections 24a, 24b, 24c and 24d, corresponding to the engagement projections 14a, 14b, 14c and 14d, respectively, of the indicator panel 4.

Figure 3:
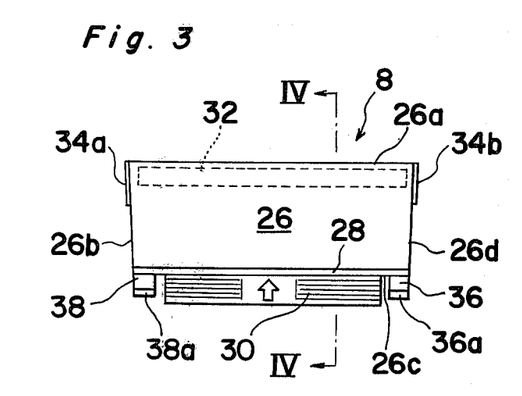
FIG. 3 is a plan view of a support plate shown in FIG. 1.
Figure 4:
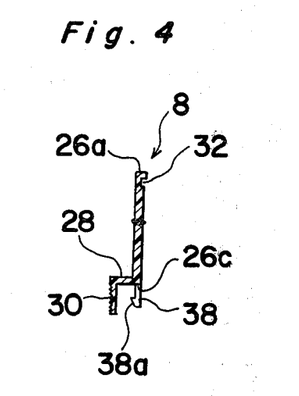
FIG. 4 is a cross-sectional view taken along the line IV—IV shown in FIG. 3.

The support plate 8 made of a synthetic resin includes a main plate 26 having a trapezoid shape defined by four side edges 26a, 26b, 26c and 26d, as best shown in FIG. 3, in which the side edges 26a and 26c are parallel to each other but the side edge 26a is greater than the side edge 26c. A wall 28 extends from the side edge 26c in a perpendicular relation to the main plate 26, while a wall 30 extends from the edge of the wall 28 remote from the main plate 26 in a direction opposite to the main plate 26. Since the longitudinal length of the wall 30 is not as long as that of the wall 28, the wall 30 is positioned at an intermediate portion between the opposite ends of the wall 28. Preferably, the front surface of the wall 30 is corrugated for facilitating the engagement with a finger touch. A pair of hook projections 36 and 38 extend laterally outwards from the opposite end portions, respectively, of the side edge 26c of the main plate 26. A pawl 36a, 38a is provided at the end of each of the hook projections 36 and 38, and extends in the same direction as the wall 28.

The supporting plate 8 further includes an elongated recess 32 extending parallel and adjacent to the side edge 26a, and a pair of flanges 34a and 34b extending laterally outwards from the side edges 26d and 26b, respectively, of the main plate 26.

The panel casing 2 preferably made of a synthetic resin includes a box-like casing portion 40 having four side walls 40a, 40b, 40c and 40d, and a front wall 42. A flange portion 41 extends outwards from the edge of the side walls remote from the front wall 42. The front wall 42 is formed with four small rectangular openings 44, 46, 48 and 50, in which the openings 44 and 46 are positioned side-by-side relation to each other and close to the side wall 40b, and the openings 48 and 50 are positioned side-by-side relation to each other and close to the side wall 40d. These openings are provided for receiving control buttons (not shown) provided on the audio device (not shown). The front wall 42 is further formed with an elongated rectangular opening 52 positioned between the openings 46 and 50. The opening 52 is provided for inserting a cassette tape (not shown) therethrough into a cassette device (not shown) for playing and/or recording sound.

A portion of the front wall 42 surrounded by the small rectangular openings 44 and 48 and the elongated rectangular opening 52 is formed with a recess 54 having a depth approximately equal to the sum of thicknesses of the indicator panel 4 and the guard plate 6. The bottom wall of the recess 54 is formed with an elongated opening 56 at a position close and parallel to the above mentioned elongated rectangular opening 52. The size of the elongated opening 56 is approximately equal to the rectangular plate 16 provided on the back of the indicator panel 4. The recess 54 is provided for receiving the indicator panel 4 and the guard plate 6, which are placed one over the other with the indicator panel 4 being directly placed on the bottom wall of the recess 54, while the elongated opening 56 is provided for receiving the rectangular plate 16. An inner side wall 54a of the recess 54 located adjacent to the elongated rectangular opening 52 is formed with three engagement recesses 58a, 58b and 58c; the recesses 58a and 58c are located at opposite end portions of the inner side wall 54a; and the recess 58b is located at the center portion of the inner side wall 54a. Each of the engagement recesses, e.g., 58a receives the engagement projections, 12a and 22a of the indicator panel 4 and the guard plate 6, respectively, when indicator panel 4 and guard plate 6 are accommodated in the recess 54.

An intermediate portion of the side wall 40a and corresponding flange portion 41a is formed with a recess 60 defined by a pair of inner side walls 62 and 64 for fittingly receiving therein the support plate 8. It is to be noted that the front side edge of the recess 60 remote from the flange portion 41a is contiguous to the adjacent side edge of the recess 54. The distance between the side walls 62 and 64 is largest at the front and is gradually narrowed towards back where the flange portion 41a is located. More particularly, the distance between the front edges of the side walls 62 and 64, which are in alignment with the front wall 42, is approximately equal to the length of the side edge 26a of the support plate 8, while the distance between rear edges of the side walls 62 and 64, which are aligned with the flange portion 41a, is approximately equal to the length of the side edge 26c of the support plate 8. the side walls 62 and 64 are formed with grooves 62a and 64a, respectively, for the engagement with the flanges 34a and 34b.

The bottom wall of the recess 60 is formed with two elongated openings 66 and 68 along the side walls 62 and 64, respectively. Each of the openings 66 and 68 extends from the flange portion 41a to the front side edge of the recess 60 and further extends into the bottom wall of the recess 54 in the shape of arcade. According to a preferred embodiment, each of the openings 66 and 68 is slightly extended into a wall defining the flange portion 41a for forming an engagement edge at portions 66a and 68a. The elongated openings 66 and 68 are provided for the path of hook projections 36 and 38 when the support plate 8 is to be slidingly inserted in the recess 60 in a manner which will be described later. The bottom wall of the recess 60 is further formed with three elongated openings 70a, 70b and 70c at a predetermined interval with each other. Each of the openings 70a, 70b and 70c extends parallel to each other and further extends into the bottom wall of the recess 54 in the shape of square. It is to be noted that these square shaped openings in the bottom wall of the recess 54 correspond to the square openings 10a, 10b and 10c formed in the indicator panel 4 and also to the square openings 20a, 20b and 20c formed in the guard plate 6. The openings 70a, 70b and 70c are provided for receiving actuator buttons (not shown) provided on the audio device (not shown) to be coupled with the display unit of the present invention.

For the purpose of path of light, the bottom wall of the recess 54 is formed with small through-holes 72a and 72b adjacent to the openings 68 and 66, respectively. These small through-holes 72a and 72b correspond, when the indicator panel 4 is mounted in the recess 54, to the small through-holes 18a and 18b formed in the indicator panel 4. Light beams emitted from the audio device pass through these small through-holes for the indication of a certain actuated condition of the audio device.

For coupling the display unit of the present invention with the audio device, four circular openings 74a, 74b, 74c and 74d are provided at four corners of the flange portion 41.

Figures 6, 7, 8:
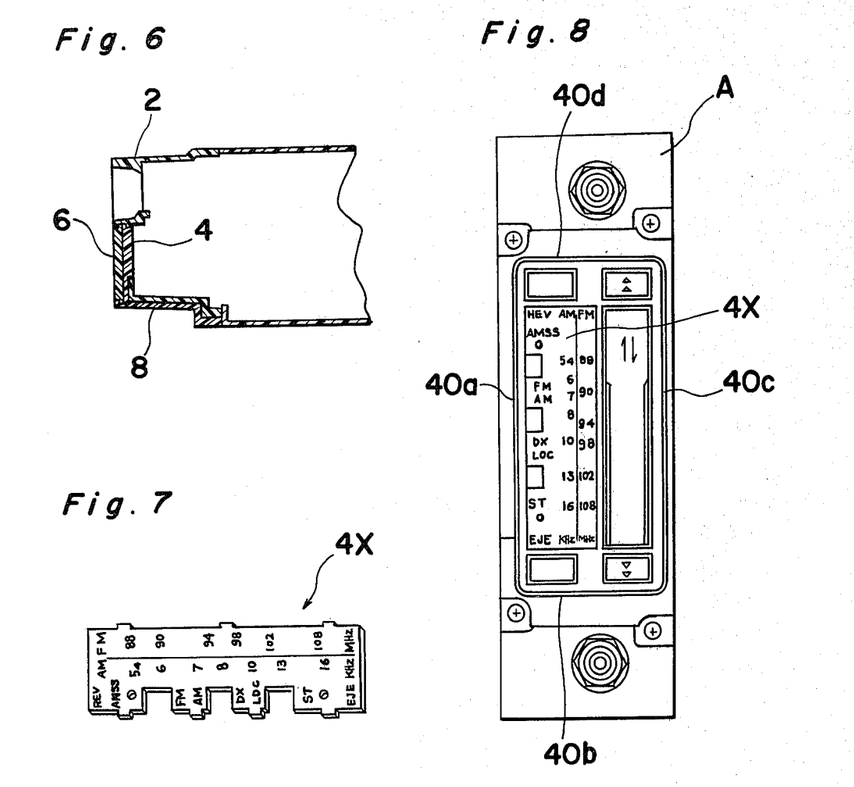
FIG. 6 is a cross-sectional view taken along the line VI—VI shown in FIG. 5.
FIG. 7 is a perspective view of another type of the indicator panel particularly showing its front surface.
FIG. 8 is a view similar to FIG. 5, but particularly shows a case when the indicator panel of FIG. 7 is employed.

Now, a manner for assembling the display unit is described. First, the indicator panel 4 is fittingly mounted in the recess 54 with its rectangular plate 16 accommodated in the elongated opening 56 and its engagement projections 12a, 12b and 12c inserted in the engagement recesses 58a, 58b and 58c, respectively. Then, the guard plate 6 is placed over the indicator panel 4 in a manner with its square recesses 20a, 20b and 20c aligned with the square recesses 10a, 10b and 10c, respectively, in the indicator panel 4. In this step, the engagement projections 22a, 22b and 22c of the guard plate 6 are also inserted in the engagement recesses 58a, 58b and 58c, respectively. Finally, the support plate 8 is slidingly inserted into the recess 60 with its flanges 34a and 34b sliding along the grooves 62a and 64a, respectively, until the walls 30 and 28, arranged so as to assume an L-shape in cross-section, engage with the flange portion 41a. When the support plate 8 is inserted into the recess 60 in the manner as described above, the hook projections 36 and 38 engage with the engagement edges 66a and 68a, respectively, for preventing the support plate 8 from being slid out from the inserted position, while the elongated recess 32 receives the engagement projections 14a, 14b, 14c and 14d of the indicator panel 4 and also the engagement projections 24a, 24b, 24c and 24d of the guard plate 6 for preventing the guard plate 6 and the indicator panel 4 from being displaced from the recess 54.

Figure 5:
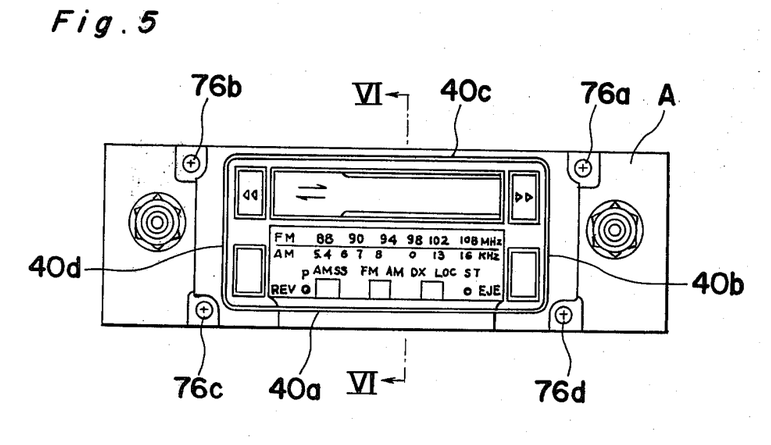
FIG. 5 is a front view of the display unit of FIG. 1 when assembled together.

After the completion of the assemblage as described above, the display unit is mounted on an audio device A by the use of securing screws 76a, 76b, 76c and 76d, as shown in FIG. 5. It is needless to say that the display unit can be assembled after the panel casing 2 has been mounted on the audio device A. The audio device A thus mounted with display unit is now ready for being mounted on the dashboard (not shown) of the vehicle horizontally so as to locate the side wall 40a of the casing portion 40 at the bottom of the casing portion 40.

When it is desired to mount the audio device A vertically on the dashboard, the direction of each indicia on the indicator panel 4 should be changed. For this purpose, the display unit is disassembled and the indicator panel 4 should be replaced with another type in a manner described below.

To disassemble the display unit, first, the wall 30 of the support plate 8 is pressed towards the body of the panel casing 2. Since the support plate 8 is made of a material having some resiliency, the pressure applied to the wall 30 disengages the pawls 36a and 38a of the hook projections 36 and 38, respectively, from the engagement edges 66a and 68a. With the pressure being so applied to the wall 30, the support plate 8 is then pushed forward in the direction indicated by an arrow on the wall 30 for detaching the support plate 8 from the panel casing 2. Thereafter, the guard plate 6 and the indicator panel 4 are removed from the panel casing 2 without any difficulty. After the display unit has been disassembled in the manner described above, the indicator panel 4 is replaced with another type of the indicator panel 4X, as shown in FIG. 7. The indicator panel 4X has the indicium so depicted on its front surface as to be in the correct readable position when the indicator panel 4 is held vertically. Then, the display unit is assembled again in the manner described above and, in turn, the audio device A is vertically mounted on the dashboard, as shown in FIG. 8, so as to locate the side wall 40b of the casing portion 40 at the bottom of the casing portion 40.

Figure 9:
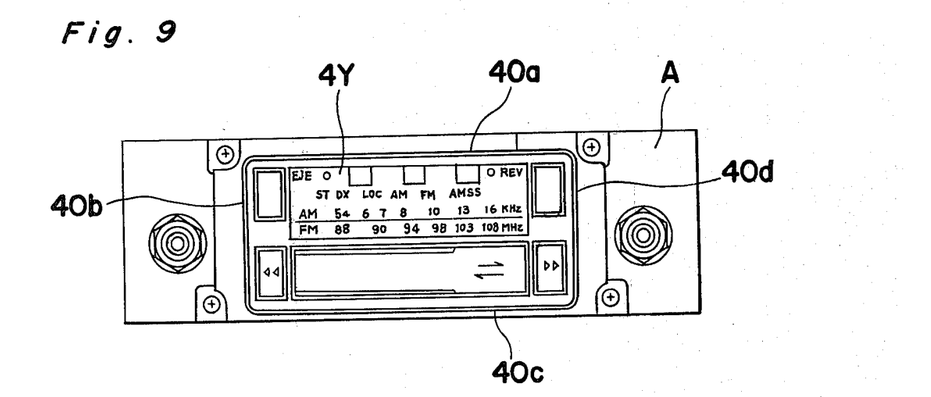
FIGS. 9 and 10 are views similar to FIG. 5, but particularly show cases when further types of the indicator panels are employed.
Figure 10:
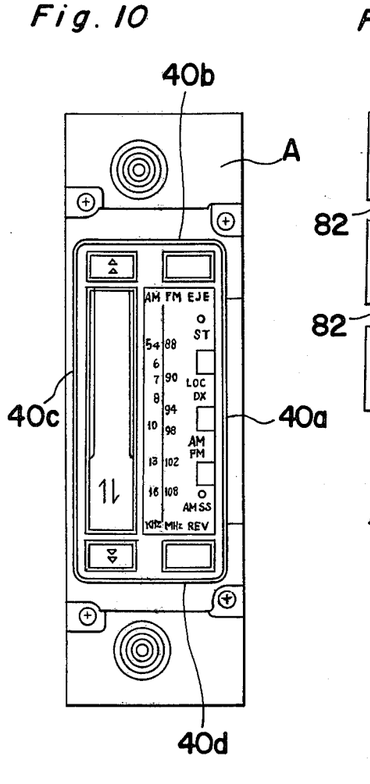

It is to be noted that the indicator panel 4 of yet another type can be selected for use in the display unit when the audio device A is to be set in the other position. For example, when the audio device A shown in FIG. 5 is to be mounted on the dashboard upside down, the indicator panel 4Y as shown in FIG. 9 is utilized. Similarly, when the audio device A shown in FIG. 8 is to be mounted on the dashboard upside down, the indicator panel 4Z as shown in FIG. 10 is utilized.

As understood from the foregoings, the indicator panel 4 can be selected or exchanged to a desired type in consideration of the type and setting of the audio device.

When packing the audio device employing the display unit of the present invention, one type of the indicator panel, e.g., 4 may be properly mounted on the panel casing 2 while the other types of the indicator panels, e.g., 4X may be attached to the audio device as the accessories. However, according to the above, the indicator panels of different types, in the step of packing, must be stocked at different places for preventing the same type of indicator panels being packed in the same package. Thus, it is necessary to maintain the various types of indicator panels under control. Furthermore, it is necessary to note down how many and what types of indicator panels are packed in each package. For avoiding such a time consuming maintenance, it is preferable to prepare the indicator panels of different types in one integral element as described below.

Figure 11:
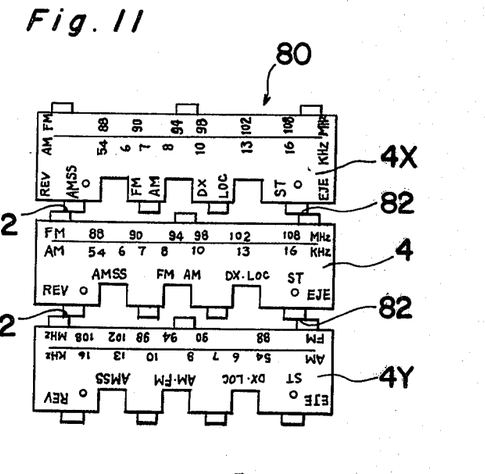
FIG. 11 is a plan view showing three types of indicator panels integrally formed together.
Figure 12:
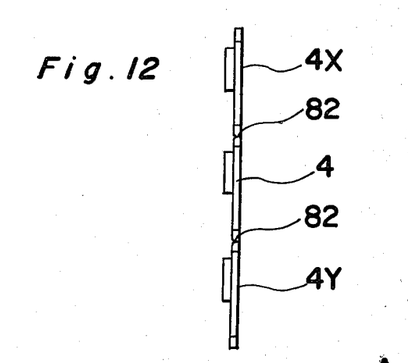
FIG. 12 is a side view of the indicator panels shown in FIG. 11.

Referring to FIGS. 11 and 12, there is shown an integral element 80 constituted by three indicator panels 4X, 4 and 4Y having different layout of the indicium. The integral element 80 is formed by the molding method and can be easily broken into pieces at thin layer portions 82 for separating the indicator panels 4X, 4 and 4Y. In the process of manufacturing the display unit, the indicator panels are produced in the form of integral elements, as shown in FIGS. 11 and 12, each integral element including a number of indicator panels having different layout of the indicium. When the display unit is ready for the assemblage, the integral element is broken into pieces in the manner described above, and one indicator panel is selected for use in the display unit. The remaining indicator panels should preferably be attached to the audio device in a manner described later.

Since the indicator panels of different types are formed in a unitary structure, namely, integral element, the indicator panels can be maintained as a single element, and, at the step of packing, one integral element is packed in each package. When in use, the integral element is broken into pieces in the manner described above for selecting and mounting a desired indicator panel onto the panel casing 2. For instructing the user, it is preferable to slip a note stating "Separate the indicator panels by braking at fragile section and mount a required indicator panel on the casing", between the panel casing 2 and the guard panel 6. If the indicator panels were provided separately in the package, the ones which are not in use may be lost or may even forget to include them in the package during the packing. For avoiding such an disadvantage, the remaining panels which are not in use should preferably be preserved in a storage compartment.

Figure 13:
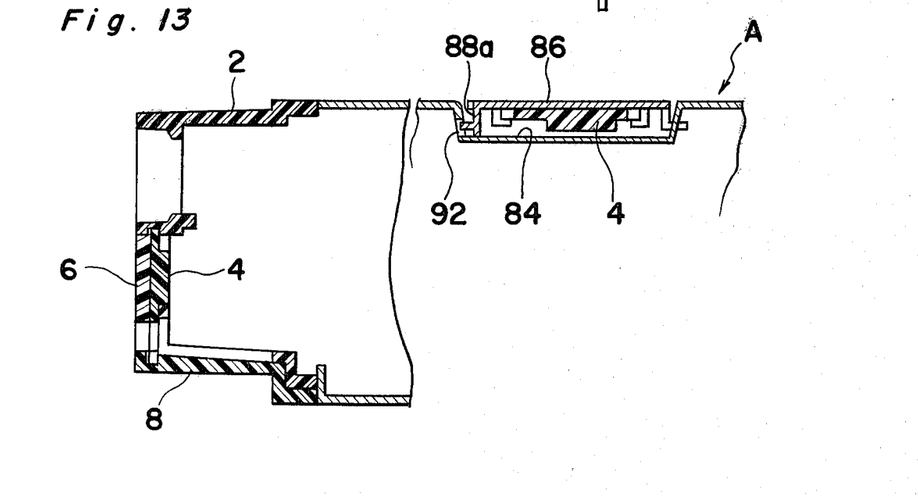
FIG. 13 is a cross-sectional view showing a storage compartment for storing an indicator panel for the purpose of replacement.
Figures 14, 16:
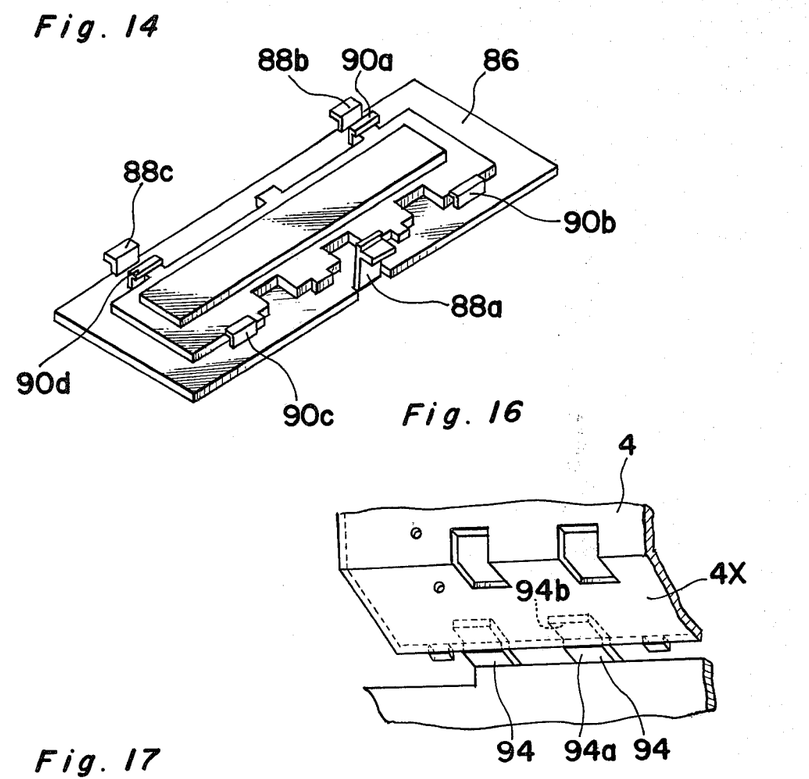
FIG. 14 is a perspective view showing an indicator panel held to a lid plate of the storage compartment.
FIG. 16 is a fragmentary view showing a manner in which an additional indicator panel is held.

Referring to FIGS. 13 and 14, a storage compartment for storing the indicator panel is constituted of an rectangular recess 84 formed in one side wall of the audio device A and a lid plate 86 for closing the rectangular recess 84. An L-shaped hook 88a is rigidly mounted on the lid plate 86 at a position closely adjacent to one side edge thereof and projects therefrom in a direction perpendicular to one flat surface of the lid plate 86. Similarly, L-shaped hooks 88b and 88c are rigidly mounted on the lid plate 86 at positions closely adjacent to the other side edge opposite to the above mentioned side edge. Four supporting arms 90a, 90b, 90c and 90d project from the same flat surface of the lid plate 86 for supporting the indicator panel in a manner as shown in FIG. 14. The lid plate 86 carrying the indicator panel is placed over the recess 84 with the surface carrying the indicator panel facing the recess 84. The recess 84 has engagement openings 92 at positions corresponding to the engagement hooks 88a, 88b and 88c for ensuring the lid plate 86 in the closed condition. For detaching the lid plate 86 from the recess 84, the engagement hook, e.g., 88a is forcibly tilted towards the plate 86 by the insertion of coin or the like into a space between the edge of the lid plate 86 and the side wall defining the recess 84.

Figure 15:
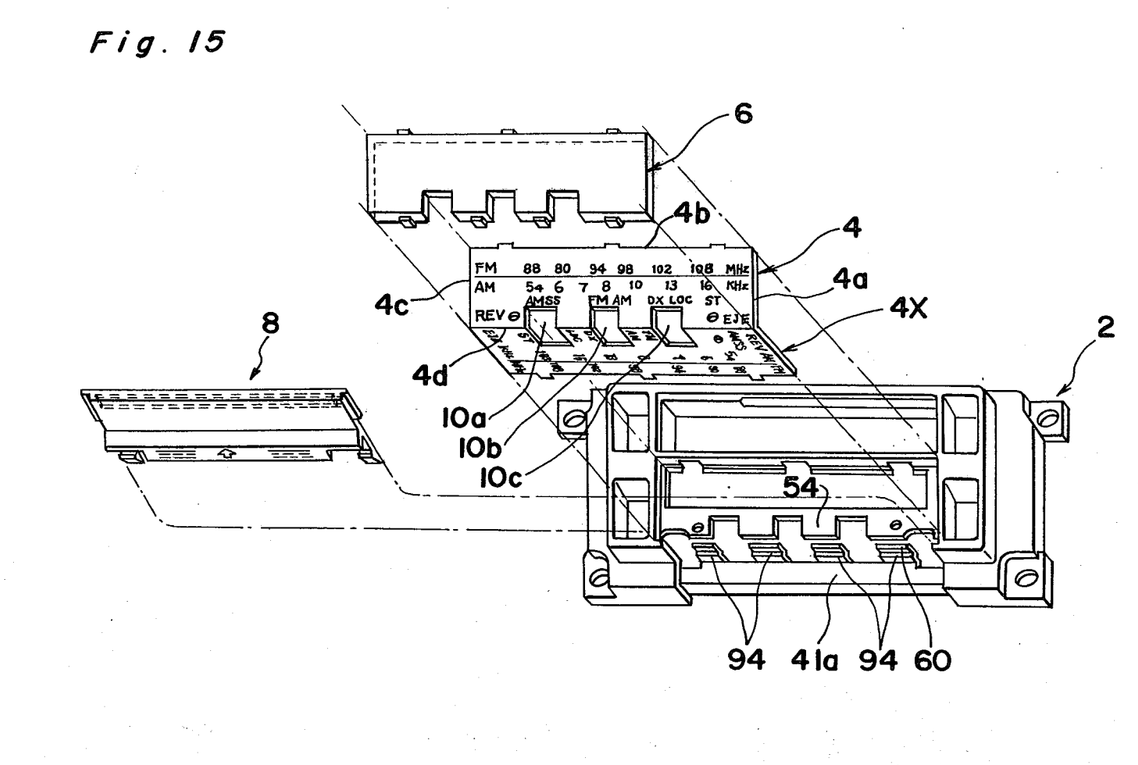
FIG. 15 is a view similar to FIG. 1, but particularly shows another embodiment of the present invention.

Referring to FIG. 15, there is shown another embodiment of the display unit. According to this embodiment, two indicator panels 4 and 4X are joined together at respective side edge formed with square recesses 10a, 10b and 10c, to assume an L-shaped cross-section. When one indicator panel, e.g., 4 is held in the recess 54 in the manner described above, the other indicator panel 4X is accommodated in the recess 60. For this purpose, the recess 60 in this embodiment is formed larger than the recess 60 of the previous embodiment as described below.

The bottom wall of the recess 60 is defined by four arms 94, each constructed by a stop element 94a and a retaining element 94b protruding outwards from the stop element 94a and laying in a plane offset relative to the stop element 94a, as best shown in FIG. 16. When the indicator panel 4X is inserted in the recess 60, the leading edge of the panel 4X is held in contact with the stop element 94a and, at the same time, the back surface of the indicator panel 4X adjacent to the leading edge is held in contact with the retaining element 94b.

After the indicator panels 4 and 4X are accommodated in the respective recesses 54 and 60, the support plate 8 is inserted into the recess 60 slidingly over the front surface of the indicator panel 4X, and is engaged in the inserted position in the manner described above.

Figure 17:
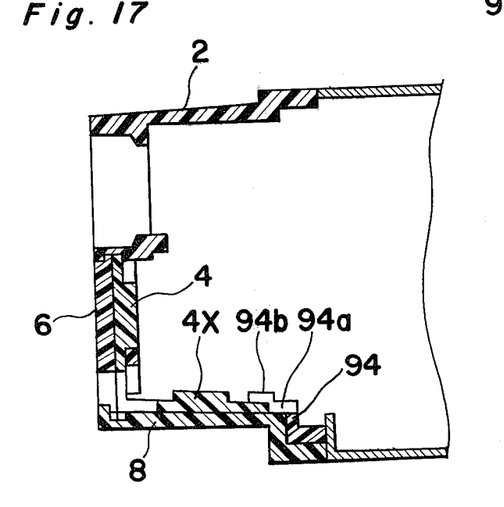
FIG. 17 is a cross-sectional view of the assembled display unit of FIG. 15.

According to this embodiment, when the support plate 8 is inserted into the recess 60, the panel 4 is retained in the recess 54 and panel 4X in the recess 60.

When it is desired to exchange the layout of the indicium from horizontal alignment to vertical alignment, the position of the indicator panels 4 and 4X is exchanged. For fittingly matching both indicator panels 4 and 4X in the recess 54, the configuration of the indicator panels 4 and 4X should be symmetrical about an imaginary line extended between the centers of the side edge 4b and the center of the side edge 4d of each indicator panel.

Figures 18, 19, 20:
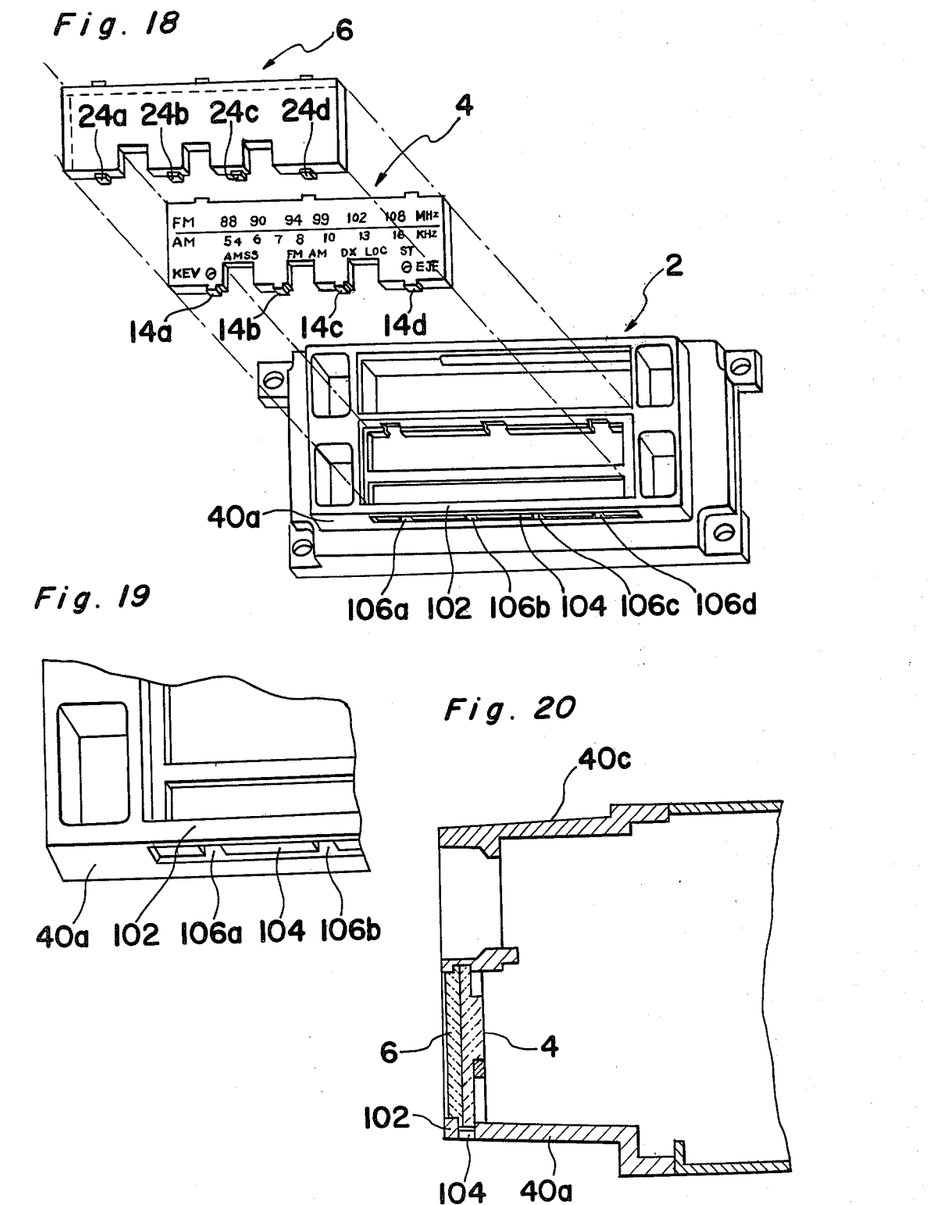
FIG. 18 is a view similar to FIG. 1, but particularly shows a further modification of the present invention.
FIG. 19 is a fragmentary view showing the details of the side wall of the casing of FIG. 18.
FIG. 20 is a cross-sectional view of the assembled display unit of FIG. 18.

Referring to FIGS. 18, 19 and 20, there is shown a further embodiment of the display unit. According to this embodiment, the support plate 8 is integrally formed with the casing 2 for forming a rib portion 102 in the front edge portion of the side wall 40a. The side wall 40a is formed with a groove 104 extending in a direction parallel to the rib portion 102. The bottom of the groove 104 is formed with four through holes 106a, 106b, 106c and 106d which communicate to the recess 54. The through-holes 106a, 106b, 106c and 106d are located at positions corresponding to the engagement projections 14a, 14b, 14c and 14d of the indicator panel 4 and also to the engagement projections 24a, 24b, 24c and 24d of the guard plate 6. Since the rib portion 102 has a thin structure, it can be simply bent downwardly by the application of an external force, and, when the external force is released, it can be returned back to its original position by its resiliency.

When the indicator panel 4 and the guard plate 6 is to be mounted on or detached from the recess 54, the rib portion 102 is bent downwardly in the manner described above.

Figure 21:
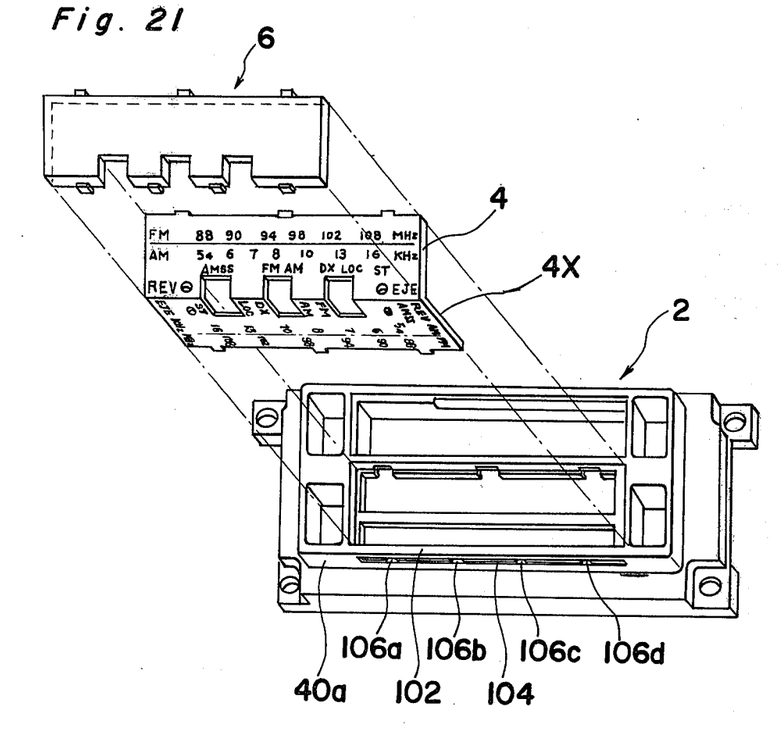
FIG. 21 is a view similar to FIG. 1, but particularly shows yet another modification of the present invention.
Figure 22:
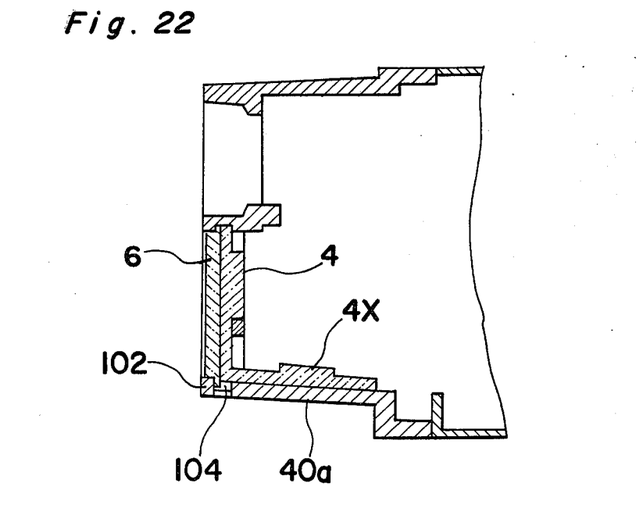
FIG. 22 is a cross-sectional view of the assembled display unit of FIG. 21.

Instead of using the single indicator panel 4, it is possible to employ the joined indicator panels as shown in FIGS. 21 and 22, in which the two indicator panels 4 and 4X are joined together in the manner described above in connection with FIG. 15.

Since the display unit according to the present invention can be simply disassembled, even after it is mounted on the audio device, the indicator panel can be exchanged to any desired type. Therefore, when the display unit of the present invention is employed, it is possible to select a desirable layout of the indicium for the display unit in consideration of the type and setting of the device.

It is to be noted that the display unit of the present invention can be mounted on a device other than audio device described above.

Although the present invention has been fully described with reference to preferred embodiments, many modifications and variations thereof will now be apparent to those skilled in the art. Therefore, unless such changes and modifications depart from the true scope of the present invention, they should be construed as included therein.

What is claimed is:

1. A display unit comprising a casing having an opening and a removable panel adapted to be mounted in said opening, said casing having a recess formed in a portion of the edge defining said opening and further having a means for detachably engaging a slidable support plate which can be inserted into and extracted from the casing, said removable panel having a projection extending outwards from a portion of the perimeter thereof and engageable in said recess, said removable panel being mounted in said opening in the casing with said projection engaged in said recess.

2. A display unit as in claim 1, further comprising a slidable support plate detachably securable to said casing adjacent said opening, said slidable support plate having means engagable with said removable panel for retaining said removable panel in the opening when said slidable support plate is attached to the casing.

3. A display unit as claimed in claim 2, wherein said removable panel has an elongated configuration and has indicium depicted thereon.

4. A display unit as claimed in claim 3, wherein said indicium on the removable panel is so depicted as to be in the correct readable position when said panel is held horizontally.

5. A display unit as claimed in claim 3, wherein said indicium on the removable panel is so depicted as to be in the correct readable position when said panel is held vertically.

6. A display unit comprising:
first removable panel means including indicium depicted therein, and having first and second means formed respectively on edge portions of said panel means opposed to each other;
a casing having first and second walls connected together to assume a generally L-shaped cross-section, said first wall having a first opening defined therein, said first opening being recessed inwardly from one edge of the first wall connected to the second wall, said first wall having a third means formed on a portion of the peripheral edge of the first opening remote from the joint of the first and second walls, said second wall having fourth means, said first panel means being adopted to be accommodated in said first opening with said first means engaged with said third means;
support plate means having fifth means and a sixth means; and
guide means for guiding said support plate means slidingly in a direction parallel to the second wall from an extracted position in which the support plate means is separated from the casing to an inserted position in which the support plate means is attached to the second wall by the guide means, said fifth means of the support plate means, when said support plate means is inserted to the inserted position, being engaged with said fourth means of the second wall for retaining the support plate means in the inserted position, and said sixth means of the support plate means, when said support plate means is inserted to the inserted position, being engaged with said second means of the first panel means for retaining the first panel means in said first opening.

7. A display unit as claimed in claim 6, wherein said first panel means comprises an indicator panel plate having indicium depicted thereon and a guard plate placed over said indicator panel plate.

8. A display unit as claimed in claim 6, wherein said first and second means are projections and said third and sixth means are recesses into which said projections are engaged, respectively.

9. A display unit as claimed in claim 6, wherein said second wall has a second opening defined therein, said second opening recessed inwardly from one edge of the second wall and being contiguous to said first opening, said support plate means being so attached to the second wall as to complement the second opening.

10. A display unit as claimed in claim 9, wherein said second opening is defined by opposed edges, the distance between said opposed edges being largest at said one edge of the second opening and gradually narrowed towards the recessed end of the second opening.

11. A display unit as claimed in claim 10, wherein said guide means is a groove formed in each of said opposed edges.

12. A display unit as claimed in claim 6, wherein said fourth means is detent recess means and said fifth means is hook means engagable to said detent recess means.

13. A display unit as claimed in claim 6 further comprising second panel means including indicium depicted therein and integrally connected to said first panel means to assume a generally L-shaped cross-section, said first means being formed on edge portion of each of said first and second panel means remote from the joint of said first and second panel means, said second means being an angled edge where said first and second panel means are jointed, said second panel means, when said support plate means is inserted to the inserted position, being held between the second wall and the support plate means.

14. A display unit as claimed in claim 13, wherein said first and second panel means have an identical configuration to each other.

15. A display unit as claimed in claim 14, wherein each of said first and second panel means has a rectangular shape with respective longitudinal side edges being connected to each other.

16. A display unit as claimed in claim 15, wherein said indicium on said first panel means is so depicted as to be in the correct readable position when said first panel means is held horizontally, while said indicium on said second panel means is so depicted as to be in the correct readable position when said second panel means is held vertically.

17. A display unit as claimed in claim 7, wherein said indicator panel plate is provided by an integral structure including a plurality of indicator panel plates, said integral structure being broken into pieces for separating the plurality of indicator panel plates.

18. A display unit as claimed in claim 6, wherein said casing further has a third wall, and further comprising a storage compartment defined in said third wall for storing a removable panel therein.

19. A display unit as claimed in claim 18, wherein said storage compartment comprises a recess formed in said third wall and a lid plate having engaging means engagable to said third wall for covering said recess, said lid plate further having holding means provided on the surface thereof which confronts said recess for holding said removable panel.

* * * * *